US008706456B2

(12) United States Patent
Mather et al.

(10) Patent No.: US 8,706,456 B2
(45) Date of Patent: Apr. 22, 2014

(54) SYSTEM AND METHOD FOR HAZARDOUS AREA CLASSIFICATION

(75) Inventors: William Mather, Houston, TX (US); Brian Harvey, Houston, TX (US); Karen Wigal, Houston, TX (US); Roy Moses, Houston, TX (US); Edward Hoeppner, Houston, TX (US); Qin Xiaoyun, Houston, TX (US)

(73) Assignee: Baker Engineering and Risk Consultants, Inc., San Antonio, TX (US)

( * ) Notice: Subject to any disclaimer, the term of this patent is extended or adjusted under 35 U.S.C. 154(b) by 743 days.

(21) Appl. No.: 12/784,301

(22) Filed: May 20, 2010

(65) Prior Publication Data
US 2010/0299110 A1    Nov. 25, 2010

Related U.S. Application Data

(60) Provisional application No. 61/213,246, filed on May 20, 2009.

(51) Int. Cl.
G06G 7/48    (2006.01)

(52) U.S. Cl.
USPC ............................................................. 703/6

(58) Field of Classification Search
USPC ........ 703/6, 2; 463/31; 705/10, 1, 29, 7.12, 7, 705/12; 340/572.8, 521, 539.13, 286.02, 340/540; 701/420; 235/375; 707/100; 702/19, 22
See application file for complete search history.

(56) References Cited

U.S. PATENT DOCUMENTS

| | | | |
|---|---|---|---|
| 5,726,884 A * | 3/1998 | Sturgeon et al. | 705/7.12 |
| 6,862,524 B1 * | 3/2005 | Nagda et al. | 701/420 |
| 2002/0138197 A1 | 9/2002 | Schramke et al. | |
| 2003/0011599 A1 | 1/2003 | Du | |
| 2003/0058103 A1 * | 3/2003 | Jansson | 340/540 |
| 2003/0146823 A1 * | 8/2003 | Jansson | 340/286.02 |
| 2003/0167214 A1 * | 9/2003 | Kang | 705/29 |
| 2005/0004770 A1 * | 1/2005 | Ouzounian | 702/22 |
| 2005/0216294 A1 * | 9/2005 | Labow | 705/1 |
| 2007/0008115 A1 * | 1/2007 | Morhard et al. | 340/539.13 |
| 2007/0033095 A1 * | 2/2007 | Hodgin | 705/10 |
| 2007/0090942 A1 * | 4/2007 | Berry | 340/521 |
| 2008/0262743 A1 * | 10/2008 | Lewis et al. | 702/19 |
| 2008/0266110 A1 * | 10/2008 | Hayford et al. | 340/572.8 |
| 2009/0045937 A1 | 2/2009 | Zimmerman | |
| 2009/0247297 A1 * | 10/2009 | Nakamura et al. | 463/31 |
| 2009/0300035 A1 * | 12/2009 | Denaro | 707/100 |
| 2009/0321511 A1 * | 12/2009 | Browne | 235/375 |

FOREIGN PATENT DOCUMENTS

WO    WO 01/25727 A1    4/2001

OTHER PUBLICATIONS

International Search Report and Written Opinion of the International Searching Authority issued in International Patent Application No. PCT/US2010/035638, mailed Dec. 23, 2010.

* cited by examiner

Primary Examiner — Kandasamy Thangavelu
(74) Attorney, Agent, or Firm — McDermott Will & Emery LLP

(57) ABSTRACT

A computer processor driven system and method capable of identifying and constructing representations of hazardous areas. The hazardous area classification system has one or more processors, and a computer readable medium containing instructions that, when executed, cause the one or more processors to perform the steps of determining a position of a hazardous area for a predetermined location using a calculation based on a plurality of parameters, and generating a representation of the hazardous area.

37 Claims, 18 Drawing Sheets

| STREAMS | | | 101 BOTTOMS TO 102 | 101 CUTOVER TO 602 | 102 BOTTOMS 1 | 102 BOTTOMS TO P-206 | 102 OVHD 1 | 11 | 12 |
|---|---|---|---|---|---|---|---|---|---|
| | 1 | 10 | | | | | | | |
| TEMPERATURE (°F) | 100 | 195.5 | 193.695 | 193.695 | 233.012 | 91.728 | 100 | 193.5978 | 210.2468 |
| PRESSURE (psig) | 85 | 280 | 253 | 253 | 106.5 | 103.5 | 98 | 260 | 240 |
| MOLECULAR WEIGHT (lb/mole) | 57 | 56.30425 | 63.195 | 63.195 | 72.688 | 72.688 | 58.12 | 56.3 | 57 |
| MASS FLOW (lb/hr) | 380000 | 380000 | 97632.36 | 0 | 39121.32 | 39121.32 | 58511.05 | 380000 | 380000 |
| MOLAR FLOW (lbmol/hr) | 6661.17 | 6747.878 | 1544.941 | 0 | 538.206 | 538.206 | 1006.735 | 6747.878 | 6668.683 |
| Std GAS FLOW (MSCFH) | 2527.339 | 2560.237 | 586.171 | 0 | 204.203 | 204.203 | 381.969 | 2560.237 | 2530.189 |
| ACTUAL GAS FLOW (ACFM) | | | | | | | | | |
| Std IDEAL LIQ VOL FLOW (USGPM) | 44.2 | 44.4 | 11.122 | 0 | 4.25 | 4.25 | 6.872 | 44.4 | 44.1 |
| ACTUAL LIQUID FLOW (USGPM) | 1341.731 | 1519.574 | 378.842 | 40.29602 | 150.36 | 126.855 | 209.234 | 1495.372 | 1409.504 |
| VAPOR PRESSURE (psi) | 64.82388 | 1.834E+16 | 40.29602 | 40.29602 | 18.0013 | 18.0013 | 52.27738 | 1.834E+16 | 1.3986E+15 |
| FLASH POINT (°F) | -1244.326 | -434.2 | -68.13117 | -68.13117 | -47.11256 | -47.11256 | -76.65653 | -434.2 | -434.2 |
| AIT (°F) | 200 | 200 | 200 | 200 | 200 | 200 | 280 | 200 | 200 |
| T-RATING | T3 | T3 | T3 | T3 | T3 | T3 | T2A | T3 | T3 |
| MESG | 1 | 0.9831221 | 1 | 1 | 0.9299362 | 0.9299362 | 1 | 0.9831221 | 1 |
| CLASS | | | | | | | | | |
| GROUP | D | D | D | D | D | D | D | D | D |
| H2O | 0.00151 | 0.00115 | | | | | | 0.00115 | 0.0015 |
| PROPANE | 0.0277 | 0.0274 | | | | | | 0.0274 | 0.0283 |
| i-BUTANE | 0.2566871 | 0.2532901 | 0.01 | 0.01 | | | 0.016 | 0.2533901 | 0.2562969 |
| n-BUTANE | 0.0959 | 0.0946 | 0.639 | 0.639 | 0.002 | 0.002 | 0.98 | 0.0946 | 0.1022738 |
| i-BUTENE | 0.1391301 | 0.1373423 | | | | | | 0.1373423 | 0.1389727 |
| i-PENTANE | 0.0349 | 0.0345 | 0.218 | 0.218 | 0.625 | 0.625 | | 0.0345 | 0.0349 |
| n-PENTANE | 0.00253 | 0.00249 | 0.109 | 0.109 | 0.314 | 0.314 | | 0.00249 | 0.00264 |

TYPE: ELECTRICAL SWITCH   TAG NO:         NAME: Alky2-JB-F-E14
MANUFACTURER: CROUSE HINDS   MODEL NO: EDSC-2129
X: 1322.7        Y: -2411.2      HEIGHT: 4.0
DEFECT: MISSING BOLTS
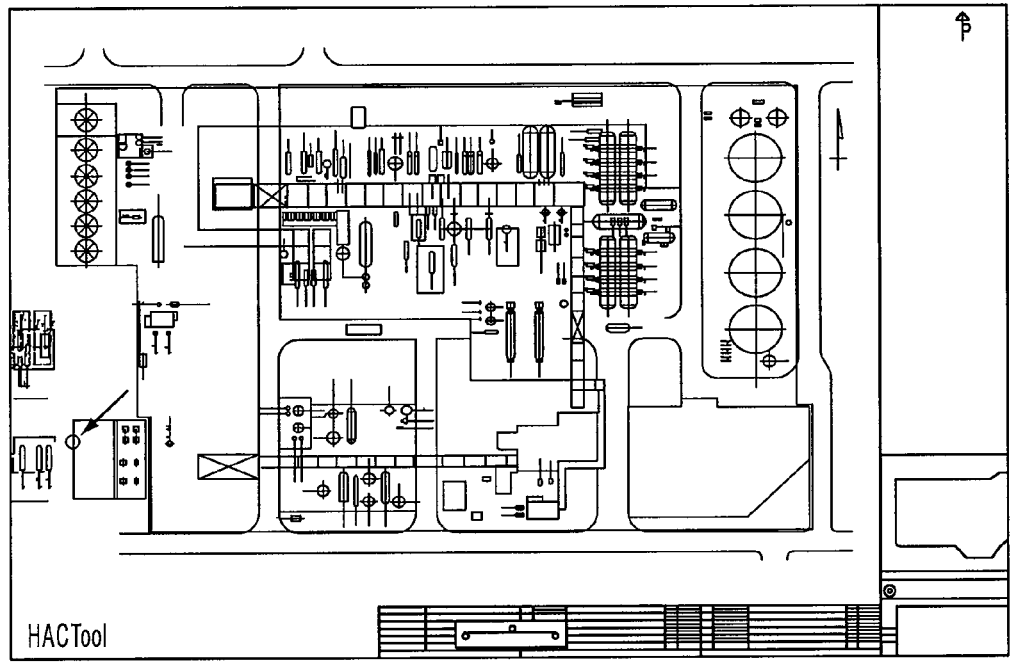
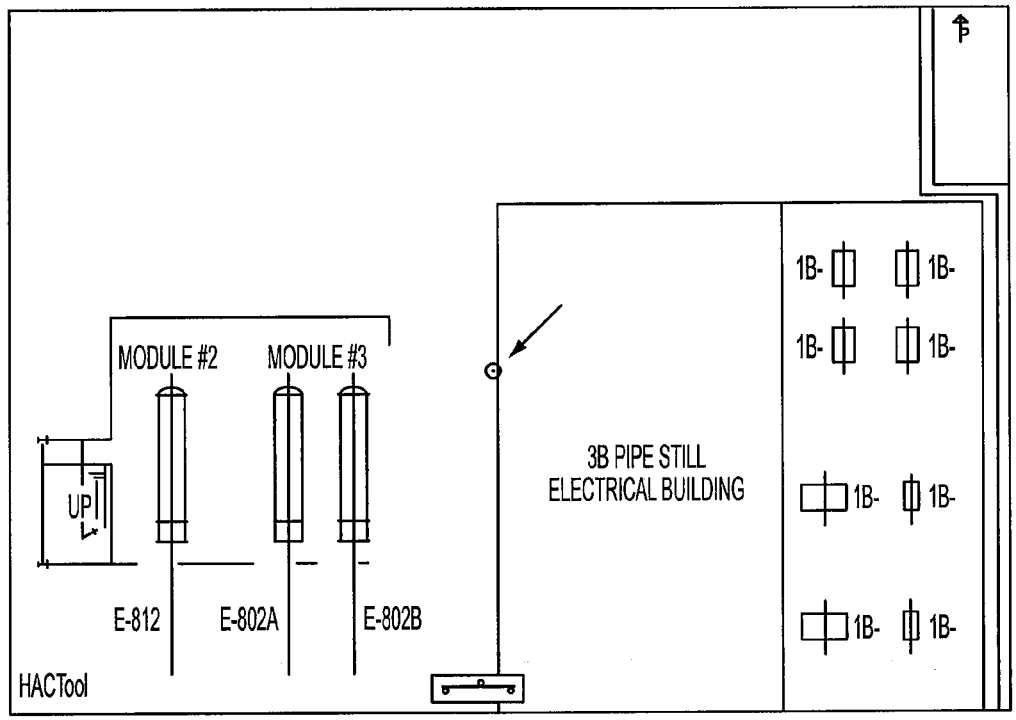
FIG. 15

TYPE: MOTOR    TAG NO: P-103A    NAME: ALKY2-HD-B-E08A
MANUFACTURER:    MODEL NO:
X: 1621.4    Y: -2098.8    HEIGHT: 3.0
LABEL UNREADABLE
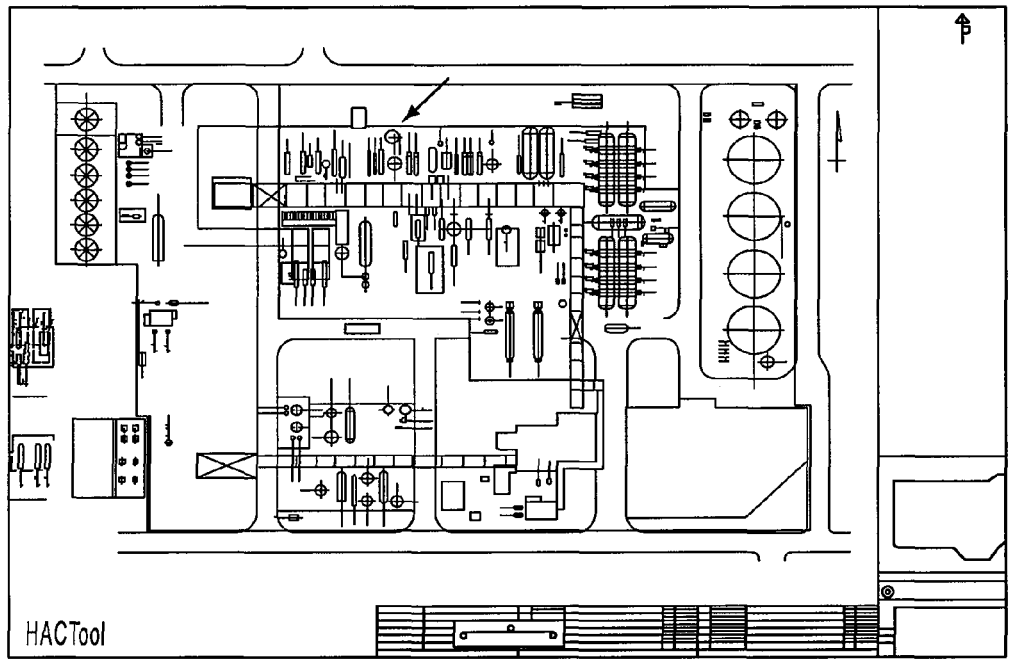
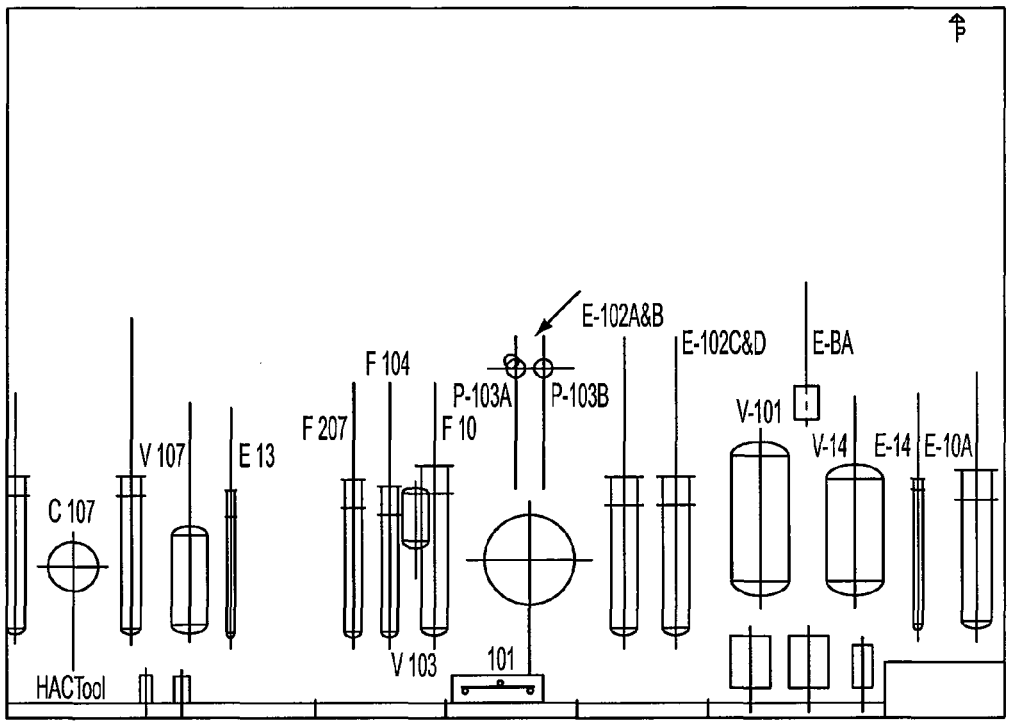
FIG. 16

SYSTEM AND METHOD FOR HAZARDOUS AREA CLASSIFICATION

CROSS REFERENCE TO PROVISIONAL APPLICATION AND RELATED APPLICATIONS

This application is based upon and claims the benefit of priority from Provisional U.S. Patent Application 61/213,246 filed on May 20, 2009, the entire contents of which are incorporated by reference herein.

BACKGROUND

1) Field of Disclosure

This disclosure relates to hazardous area classification. The present disclosure has particular applicability to systems and methods for classifying hazardous areas by use of calculations based on certain parameters and generating visual representations based on the calculations.

2) Description of Related Art

Hazardous area classification is an important aspect of operating a materials processing facility. Currently, manufacturers and processors of chemical compounds must meet guidelines for safety. The United States standard for the safe installation of electrical wiring and equipment is the National Electrical Code (NEC), or NFPA 70. NFPA 70 is a part of the National Fire Codes series published by the National Fire Protection Association (NFPA). In addition, oil refineries must meet standards set by the American Petroleum Institute (API), an American National Standards Institute (ANSI) accredited standards developing organization, such as API RP 500.

Conventional methods of meeting the above guidelines consisted of hand drafted maps identifying hazardous areas. However, calculations involving detailed aspects of complicated mixtures of materials are difficult and time consuming. Furthermore, the ability to construct hand drawn maps requires advanced knowledge of drafting or map making. Moreover, conventional hand drafted maps do not show certain information, such as the extent of hazardous ranges, or heights and elevations of hazardous areas.

SUMMARY

In order to overcome the problems discussed above, the present disclosure is directed to a computer processor driven system capable of identifying and constructing representations of hazardous areas. The hazardous area classification system comprises a processor, and a computer readable medium containing instructions that, when executed, cause the processor to perform the steps of determining a position of a hazardous area for a predetermined location using a calculation based on a plurality of parameters, and generating a representation of the hazardous area.

The disclosure is also directed toward a method for hazardous area classification, comprising the steps of inputting a plurality of parameters related to a material, using a processor to determine the position of a hazardous area in a predetermined location based on the parameters, and using the processor to generate a representation of the hazardous area.

The disclosure is also directed toward a method for performing a gap analysis of an area, comprising the steps of inputting a plurality of parameters related to a material, using a processor to determine the position of a hazardous area in a predetermined location based on the parameters, and using the processor to generate a report indicating the electrical safety and ignition sources of the hazardous area with regard to the material. Optionally, the gap analysis uses the processor to generate a report indicating defects in a risk level and location of electrical equipment within the hazardous area. The gap analysis may also use the processor to generate a report identifying mislabeled or unvalidated electrical equipment in the hazardous area.

The disclosure is also directed toward a method for hazardous area classification, comprising the steps of selecting a location for analysis, identifying a material for analysis, identifying a container for containing the material, using a processor to calculate a stream data for the material based on the quantity, temperature, pressure and rate of flow of the material in the container, identifying a release point in which the material is releasable from the container, identifying a parameter of a building in which the material and container is housed, selecting a region of the location for analysis, identifying potential ignition sources within the region, using a processor to determine the position of a hazardous area in the region based on the information obtained in these steps, and using a processor to generate a representation of the hazardous area in the region.

The disclosure is also directed toward a computer readable medium, containing instructions that, when executed, cause a processor to perform the steps of determining a position of a hazardous area for a predetermined location using a calculation based on a plurality of parameters, and generating a representation of the hazardous area.

In some embodiments of the present disclosure, the representation of the hazardous area is a 3-dimensional representation.

Additional advantages and other features of the present disclosure will be set forth in part in the description which follows and in part will become apparent to those having ordinary skill in the art upon examination of the following or may be learned from the practice of the disclosure. The advantages of the disclosure may be realized and obtained as particularly pointed out in the appended claims.

As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

FIG. 3 is an example of a process stream data entry form according to another embodiment of the present disclosure;

FIG. 4 is an example of a release point data entry form according to another embodiment of the present disclosure;

FIG. 11 is an example of a road data entry form according to another embodiment of the present disclosure;

FIG. 15 is a defects report and map indicating a defect obtained from a gap analysis according to another embodiment of the present disclosure;

FIG. 16 is a representation of a label report indicating the location of unidentified and unvalidated electrical equipment obtained from a gap analysis according to another embodiment of the present disclosure;

DETAILED DESCRIPTION

Figure 1:
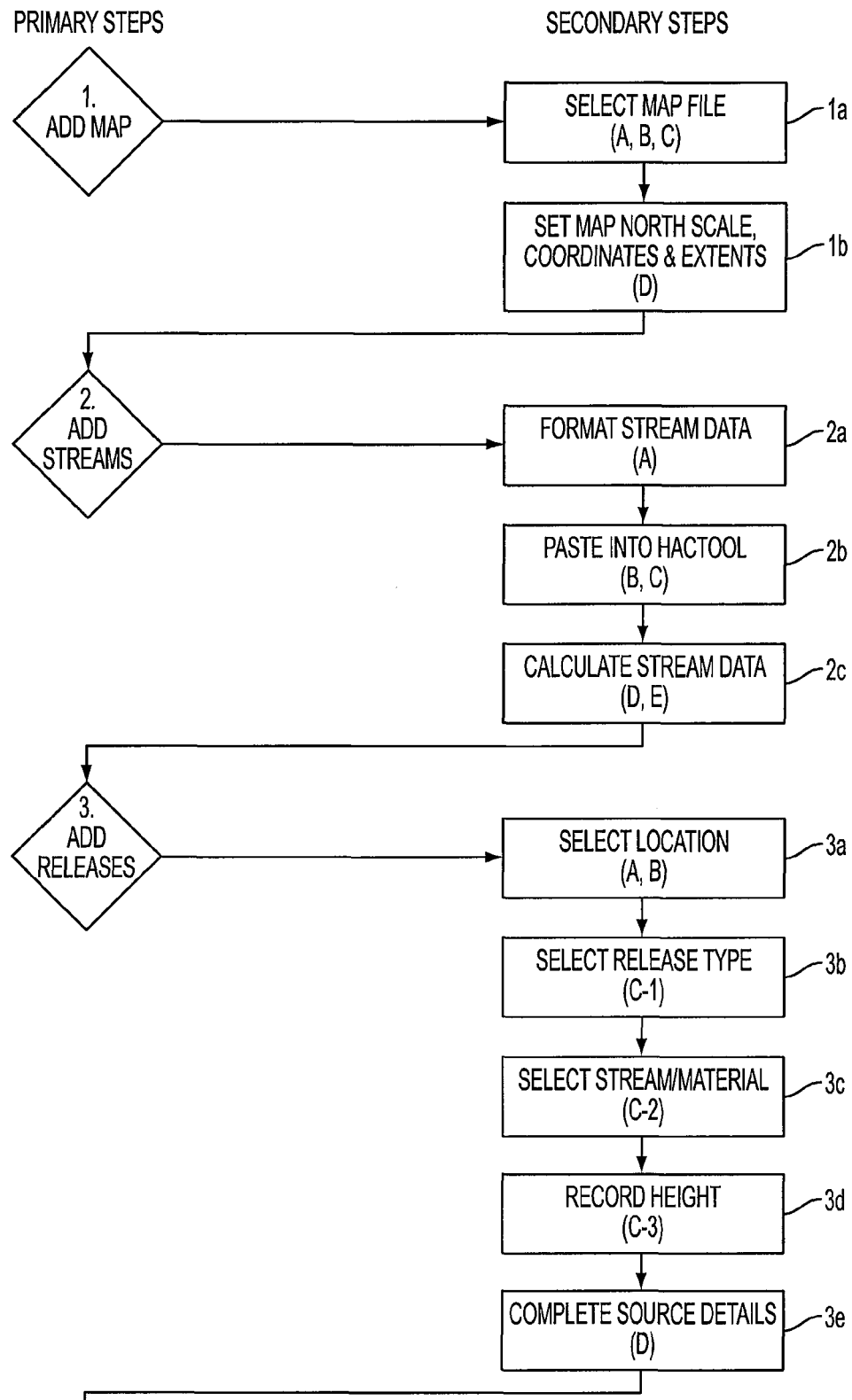
FIGS. 1 and 2 are flow charts showing the process steps of generating representations of hazardous areas according to another embodiment of the present disclosure.

The drawing figures depict one or more implementations in accord with the present teachings, by way of example only, not by way of limitation. In the figures, like reference numerals refer to the same or similar elements.

Figure 2:
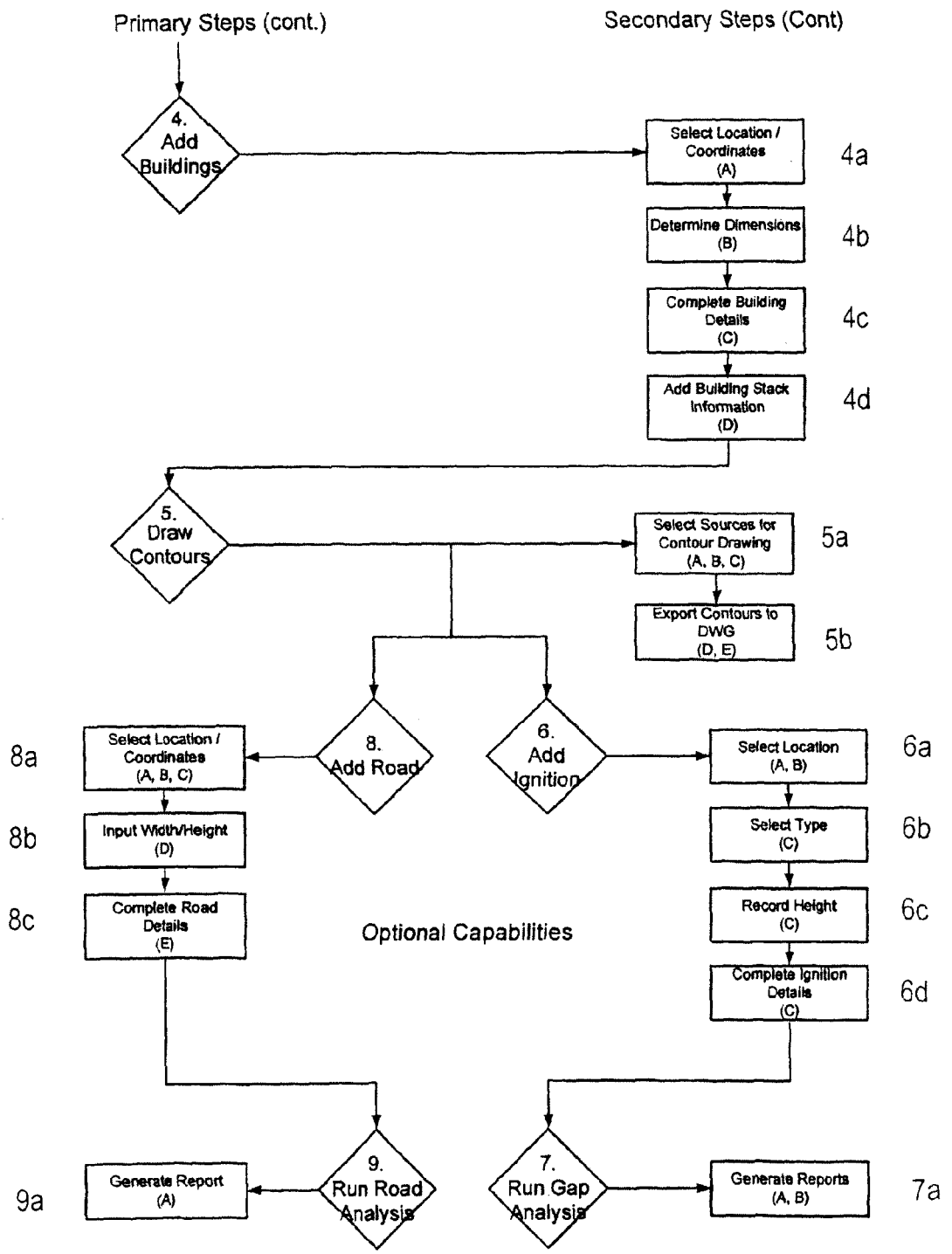

FIGS. 1 and 2 show general steps for a method of hazardous area classification. Hazardous areas are classified by utilizing one or more processors and a non-transitory computer readable medium containing a set of instructions that, when executed, cause the one or more processors to determine a position of a hazardous area for a predetermined location using a calculation based on a plurality of parameters and then generating a representation of the hazardous area. The parameters include, but are not limited to a quantity of a material, a temperature of the material, a pressure of the material, a size of a container containing the material, a rate of flow of the material within the container, a release point of where the material is releasable from the container, a parameter of a building in which the container and material is housed, a location of an ignition source, a location of a road, a size of the road, and an amount of vehicular activity on the road. However, any other parameters that may contribute to the determination of a hazardous area may also be used.

The steps disclosed herein can be implemented using well-known conventional computer programs such as VisualBasic.NET™ (available from Microsoft Inc., Redmond, Wash.) and can use a conventional framework such as Microsoft. NET™ (available from Microsoft Inc., Redmond, Wash.) to define and draw the representations. One embodiment of the disclosed methodology is a computer program entitled "HACTool" utilized to conduct steps for performing the hazardous area classification. In use, HACTool is opened and a new file is created for each location to be classified. The method comprises a step 1 of selecting a location for analysis, for example, a map. The map may be of various vector and raster formats suitable for computer graphical drawing. This map is selected in step 1a of FIG. 1. Examples of these formats include .DWG, .DGN, .JPG, .TIF, .BMP, or the like. Information for certain map parameters such as the direction of north, the size and extent of the map, map coordinates, and any other information necessary to draw a map is inputted by a user in step 1b.

In step 2, a material in a stream is identified for analysis. Generally, hazardous materials are volatile. Data regarding mole fraction, temperature, pressure, molar flow, mass flow, standard ideal liquid volume flow, standard gas flow, actual liquid flow, actual gas flow and molecular weight of the material is added by a user into a spreadsheet for each material to be analyzed. The HACTool will format the material data into stream data indicating area where the material or stream will flow into or occupy in step 2a. The formatted stream data is set (i.e., pasted) in the HACTool database program in step 2b and then a calculation is performed to provide each stream with a group and classification in step 2c. FIG. 3 shows a sample form of the process stream data entered and calculations made.

The HACTool is equipped with a chemical database that is used to identify a list of representative materials that make up the material composition of the stream. From this list and accompanying chemical properties, HACTool then performs a calculation to predict various properties of the Stream, including the Temperature Rating, Maximum Experimental Safe Gap, Auto Ignition Temperature, Flash Point, Group and Class. In one embodiment, the calculation is Raoult's Law, where $p=p^*_A X_A + p^*_B X_B + \ldots$, where p is the partial vapor pressure of the mixture, $p^*$ is the vapor pressure of the pure component and $X_i$ is the mole fraction of the component in solution. Then the HACTool calculates the material composition of the vapor phase via partial pressure with the equation $p_i=(p^*_A X_A)$, so the vapor fraction is determined. The flash point is determined via Le Chatelier's equation. Other equations suitable for calculating vapor pressure, partial vapor pressure and flash point may also be used.

Figure 4:
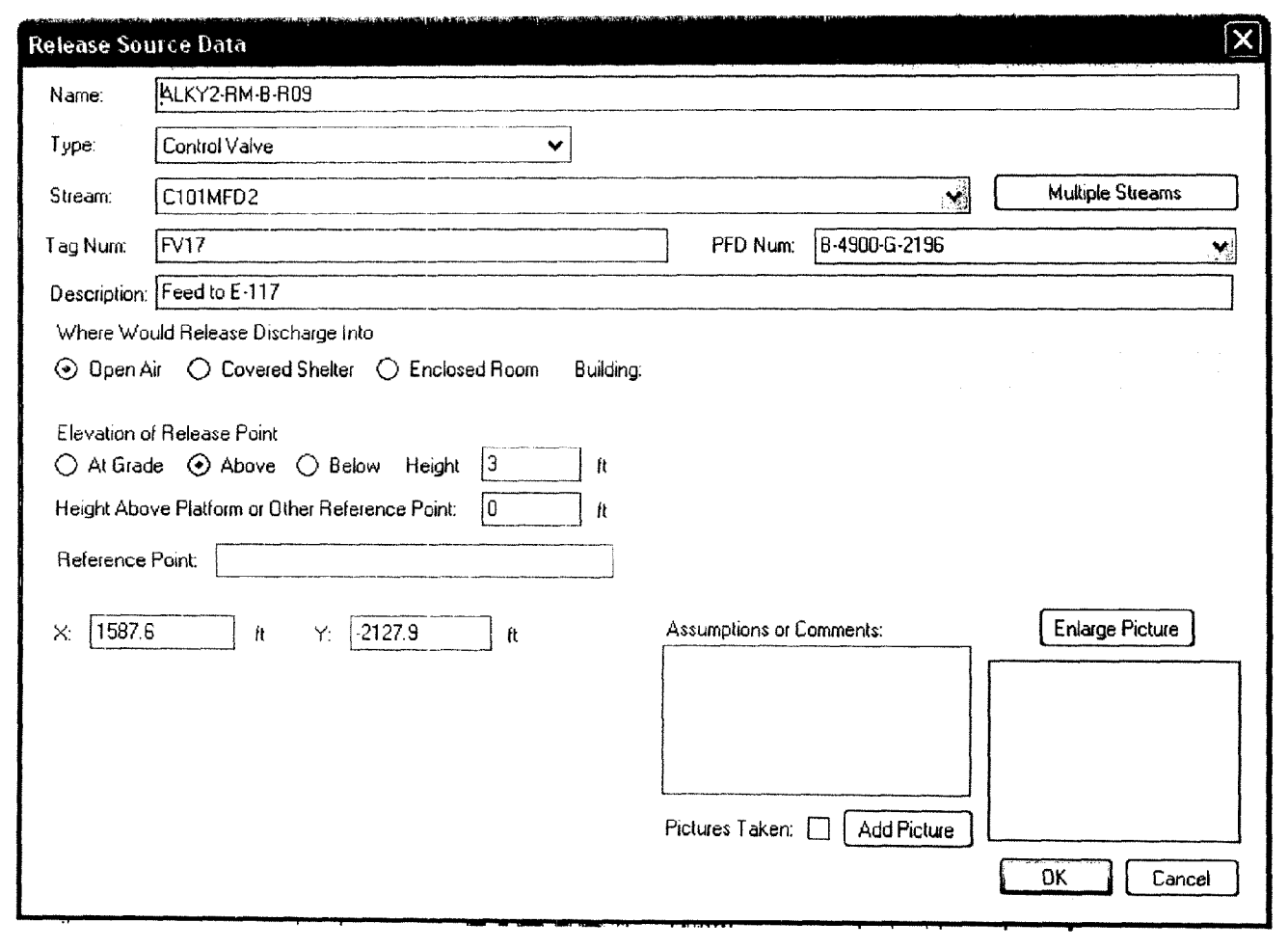
Figure 5:
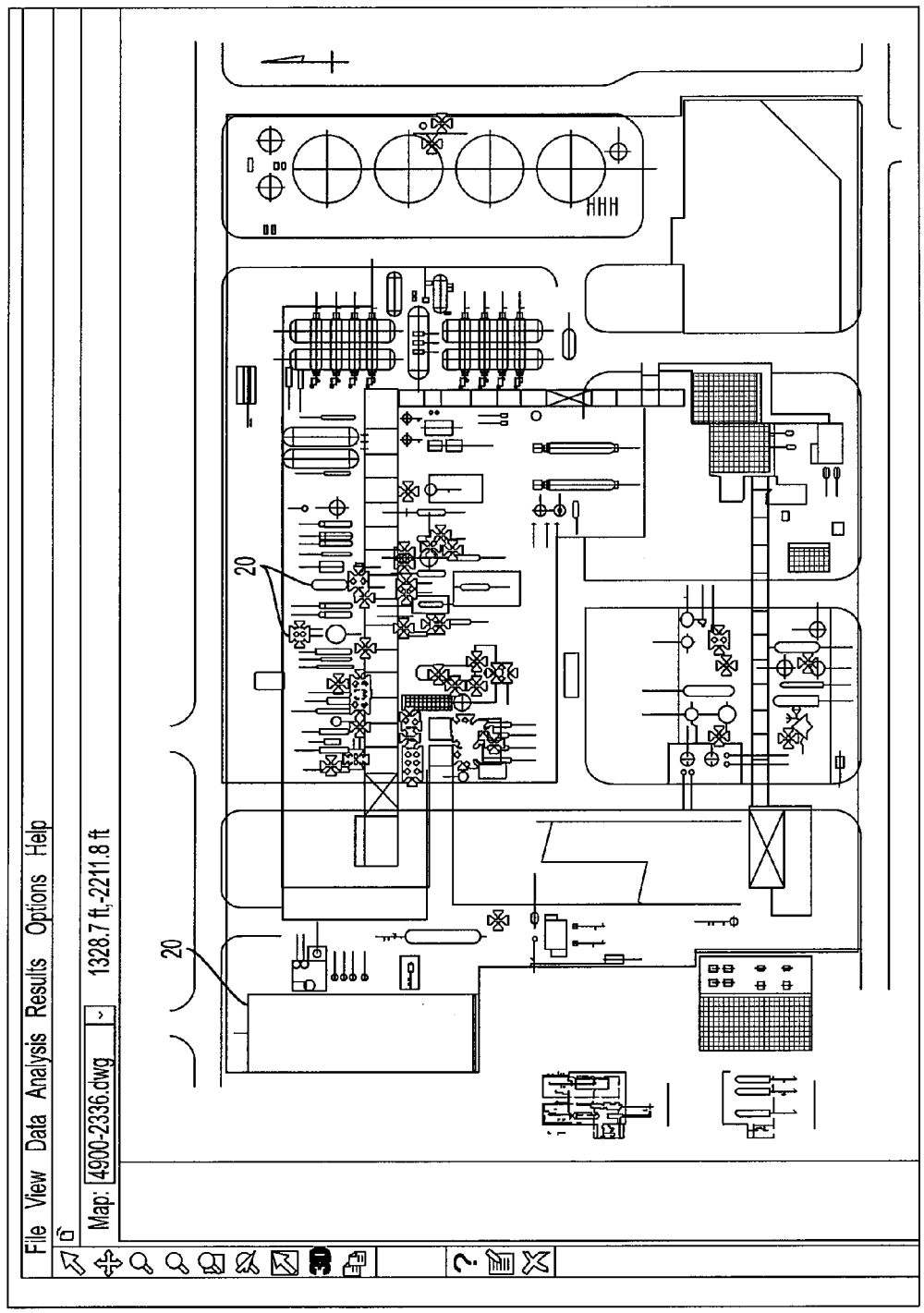
FIG. 5 is a top view of a representation indicating release points for hazardous materials according to one embodiment of the present disclosure.

In step 3, a container for containing the material is identified. The container may be a vessel, a pipe, or any other area in which the material may flow or be stored. The identification of the container also determines where and how the hazardous material may be released into the environment. A location is selected by a user on the map or area showing where the container is located in step 3a. A drop down list showing release sources such as a compressor seal, control valve, motor operated value, relief valve, sump and the like is used to select the release source for each container location in step 3b. Depending on the type, different parameter data will be needed. For example, a vessel needs dimensions, a control valve does not. Once a source is entered, it will be displayed on an interface, such as a computer screen. FIG. 4 shows an example of a data entry form (i.e., a dialog box) for release data. The type of material in each container is applied to the container in step 3c. FIG. 5 shows a 2-dimensional representation of a map having various containers with release points 20. However, in other embodiments, the representation is 3-dimensional.

In step 3d, the height of the release point is recorded. The ability to indicate release points 20 as a location in a 3-dimensional, x-y-z plane as well as the ability to define dimensions of equipment allows for the hazardous areas 40 (see, FIG. 12) to be drawn in a 3-dimensional representation. This provides valuable information since some contours 40 drift up (lighter than air) while others fall to the ground (heavier than air). In some examples, if a release source 20 is high enough above grade, the hazardous area 40 around it may not actually reach the ground. These examples can be clearly seen in HACTool's 3-dimensional model, but may be missed in a traditional 2-dimensional representation.

In step 4 shown in FIG. 2, a parameter of a building in which the material and container is housed is identified. Exemplary parameters of a building are the physical dimensions, such as length, width and height, as well as coordinates such as the location on the map, the elevation, etc. These are selected in steps 4a and 4b. HACTool allows for buildings to be defined in a way that describes whether they are or are not adequately ventilated, airtight, or pressurized in accordance with NFPA 496 rules. Defining the buildings in this way allows the programming in HACTool to auto generate the area classification for buildings based on whether there are release points outside of the building, inside the building, or both.

Figure 6:
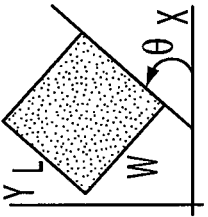
FIG. 6 is an example of a building data entry form according to another embodiment of the present disclosure.
Figure 7:
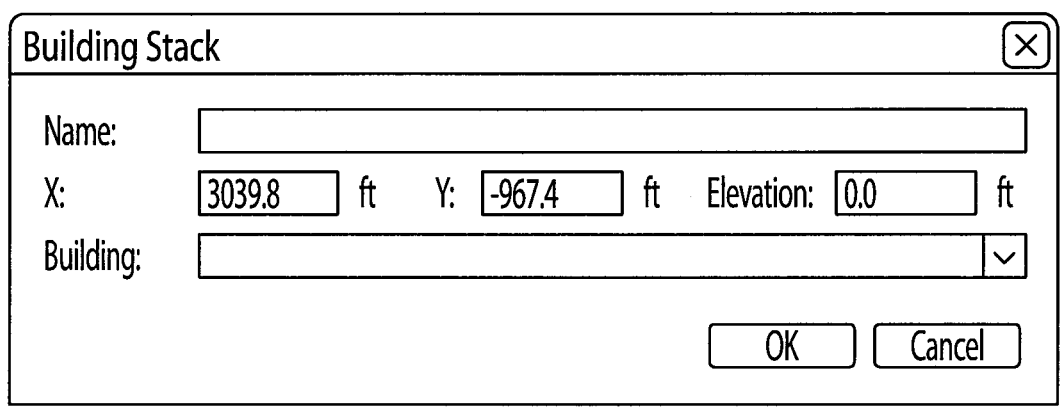
FIG. 7 is an example of a pressurized building stack data entry form according to another embodiment of the present disclosure.

To add buildings to the HAC Tool map, a user selects the location of two corners of the buildings to form a red line in step 4c. The line is then manipulated by the user, such as with a mouse, to create the dimensions of the building. FIG. 6 shows a building definition screen for inputting and drawing the building information and shapes. Stack location and details are added for pressurized buildings in step 4d. FIG. 7 shows a form for adding building stack information. HACTool allows pressurized building intake stacks to be located in a 3-dimensional location. Defining the stacks in this way allows the programming in HACTool to identify whether stacks are located in an approved location per the guidelines set forth in NFPA 496.

Figure 8:
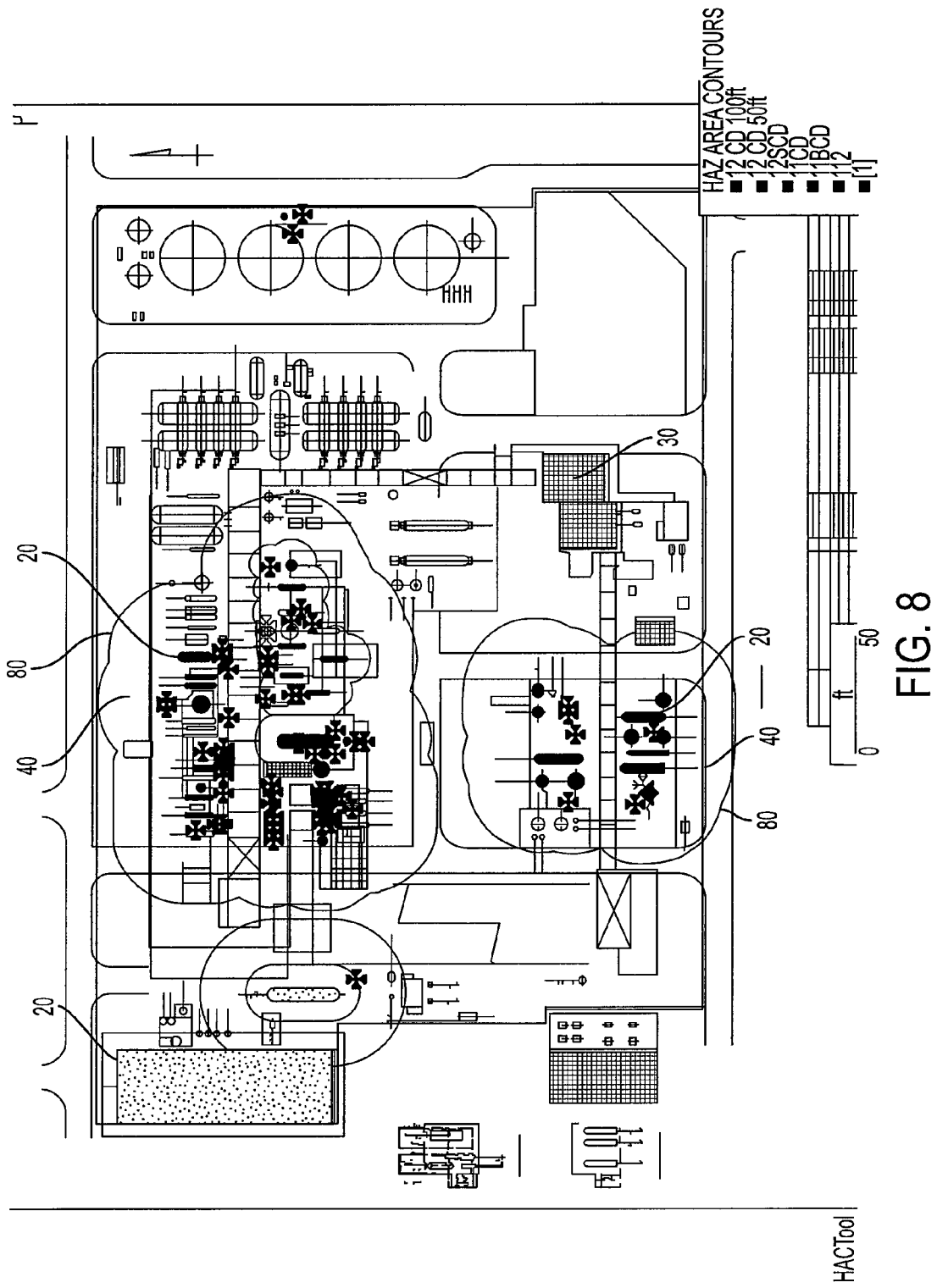
FIG. 8 is a top view of a 2-dimensional representation indicating hazardous area contours according to another embodiment of the present disclosure.

In step 5, a region of the location for analysis is selected. Classification contours are drawn on the map in step 5a. FIG. 8 shows these contours 80 as applied to a set of release points. The ability to quickly choose different sets of release points in HACTool is a unique feature. With this ability, contours can be drawn for different situations: the whole facility, a specific unit, or a specific set of equipment. In addition, HACTool provides a method to show how altering the facility affects the area classification. For example, if a specific set of equipment is to be removed from the facility, redrawing the area classification in a traditional method takes hours, if not days; but with HACTool, it can be done in minutes.

The hazardous area contours can be saved as an additional layer in an industry-standard vector graphics file in step 5b. This allows the contours to be edited and remain clear when large drawing sizes are printed. Retaining the drawing in such a format onsite also allows the area classification to be retained at the facility as a living document that can be updated to reflect process and equipment changes, if necessary.

Figure 9:
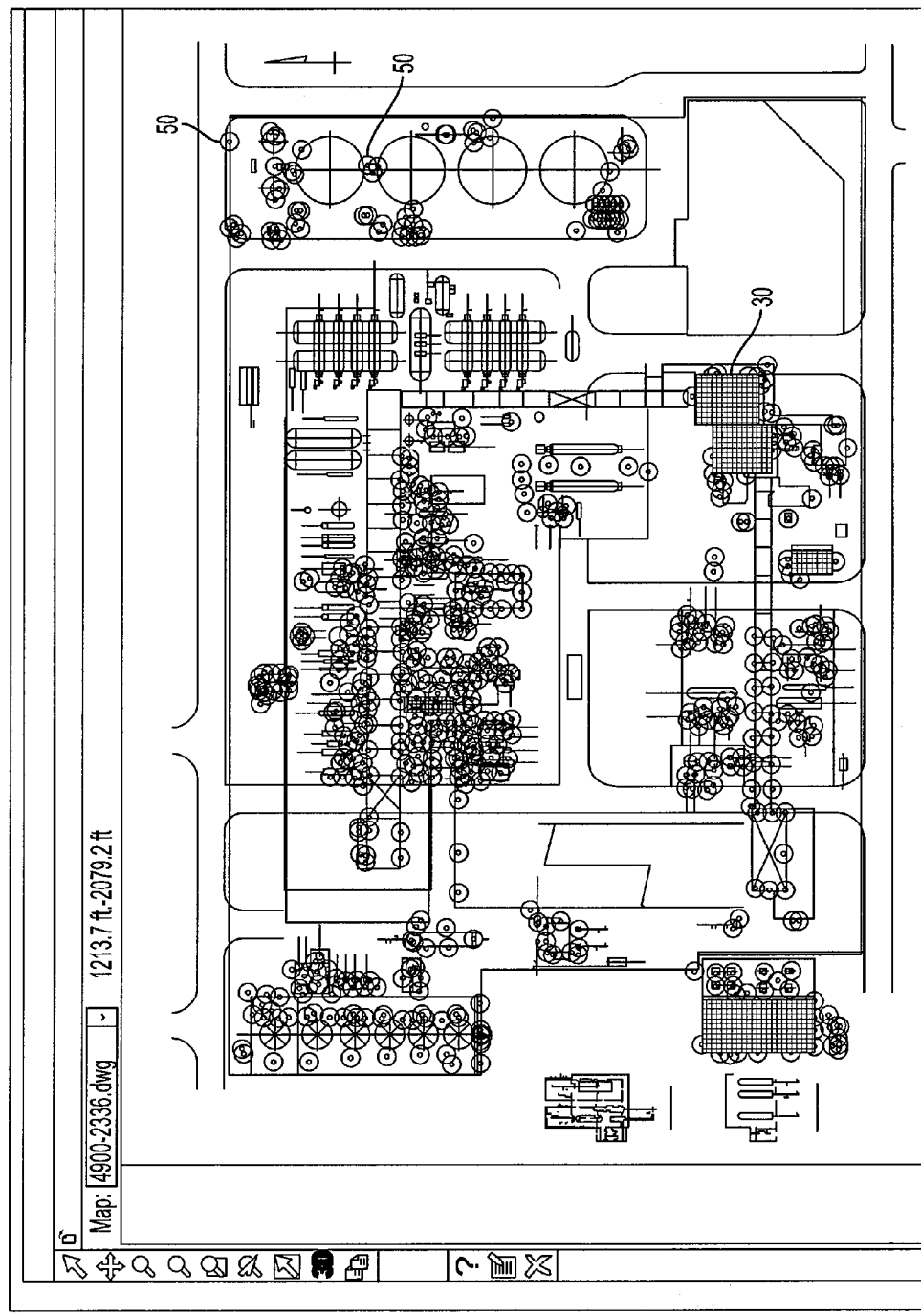
FIG. 9 is a top view of a representation indicating ignition sources according to another embodiment of the present disclosure.
Figure 10:
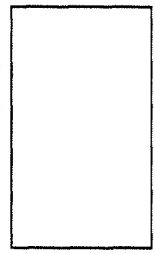
FIG. 10 is an example of an electrical hazards data entry form according to another embodiment of the present disclosure.

In step 6, potential ignition sources within the region are identified. As is shown in FIG. 9, the location on the map where the ignition source 50 is located is entered by the user in step 6a. The type of ignition source is selected in step 6b. As is shown in FIG. 10, the type of ignition source is entered by a user in the form. Thus, HACTool provides a range of electrical equipment that is typically seen in a facility. Examples of electrical equipment in the HACTool database include motors, transmitters, switches, etc. HACTool also gives the user the ability to define what the equipment is rated for to easily determine through an automated query whether the ignition source is properly rated for its location. An electrical equipment database has been compiled for HACTool that the electrical rating information to be automatically populated by the software based on the make and model number for equipment used in a facility.

Figure 14:
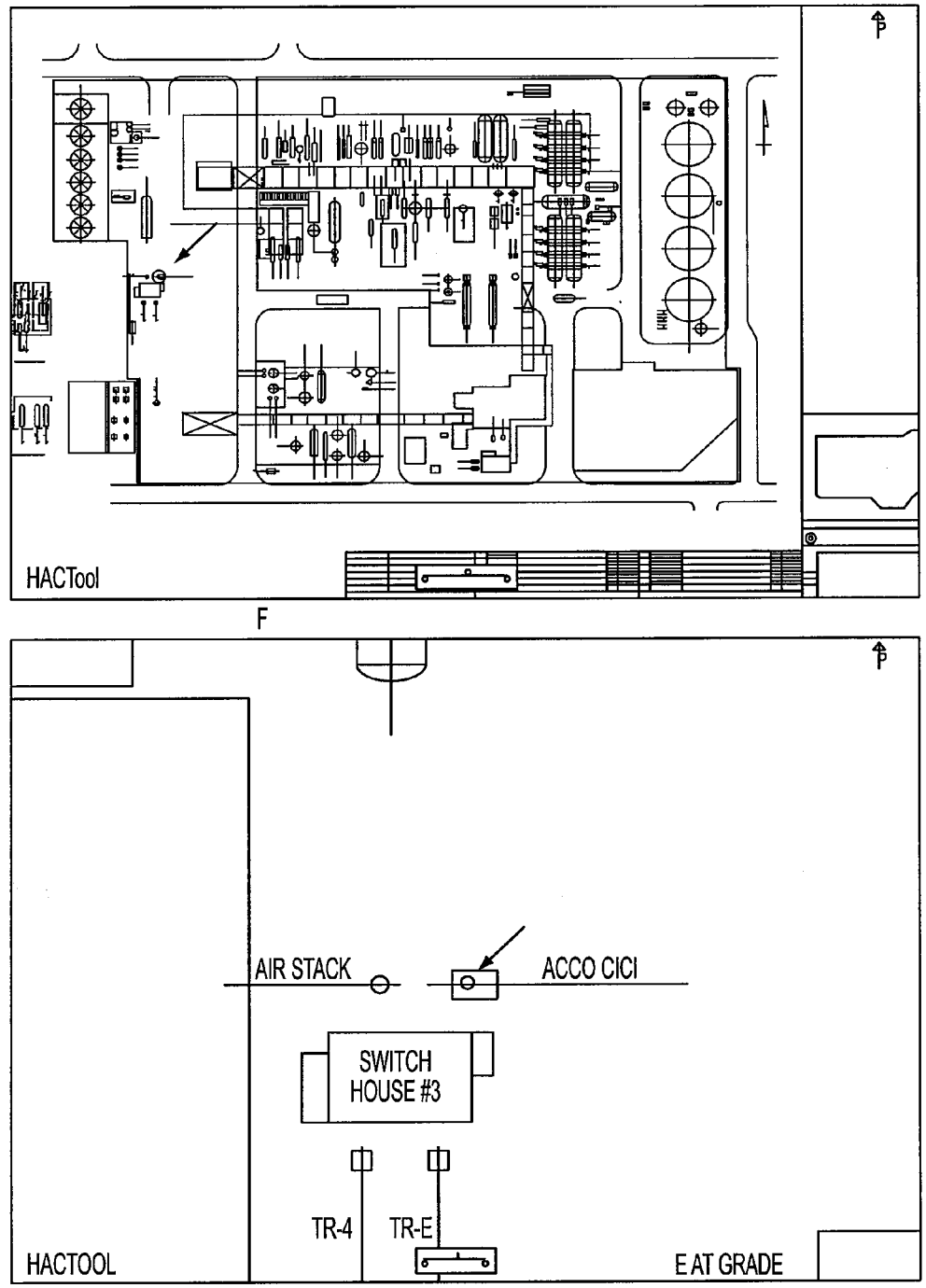
FIG. 14 is a representation of a gap report indicating incorrectly positioned electrical equipment obtained from a gap analysis according to another embodiment of the present disclosure.

Several types of gaps reports may be performed in step 7 by inputting the parameters related to a material, such as those shown above, and then using a processor to determine the position of the hazardous area in a predetermined location based on the parameters. Then, the processor is used to generate a specific report in step 7a. In one embodiment, a gaps report shows the electrical safety and ignition sources of the hazardous area with regard to the material. The report features a map and a close up of a portion of the map where the hazardous area is located. The hazard is pointed out by an arrow in each figure. For example, FIG. 14 shows a location where a light fixture is improper for the area it is located, as indicated by the arrow.

Another gaps report indicates defects in a risk level and location of electrical equipment within the hazardous area. For example, FIG. 15 shows a location of a defect, i.e., a missing cover, in a facility, by an arrow.

Another gaps report shows all electrical equipment having a missing label or that is unvalidated in the hazardous area. As shown in FIG. 16, the map indicates a label that is unreadable, by an arrow.

The programming for HACTool autogenerates a gap analysis using a 3-dimensional query that looks for each ignition source and the classification area in which it is located. This automated programming allows for the analysis of thousands of ignition sources within a short time frame.

Figure 17:
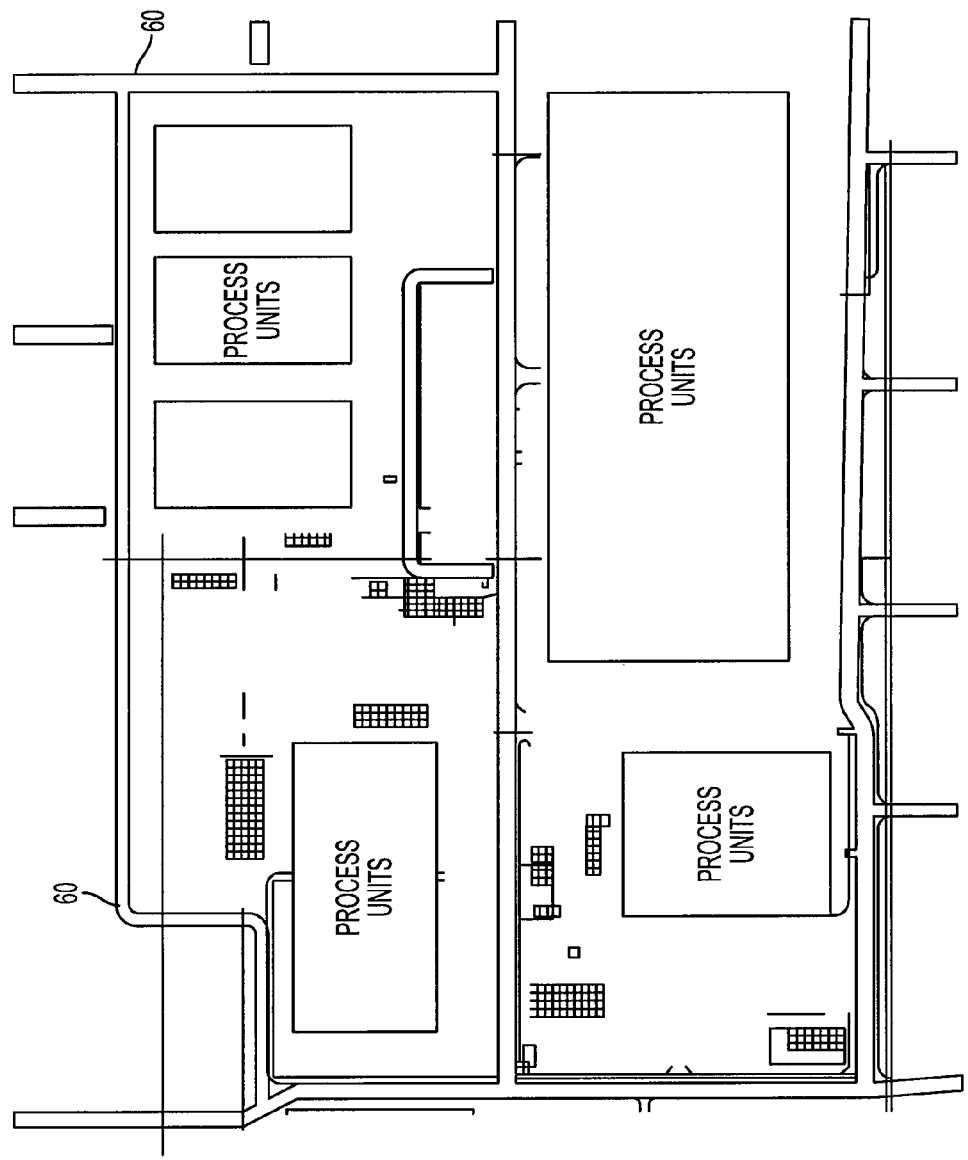
FIG. 17 is a top view of a representation showing roads according to another embodiment of the present disclosure.

Another embodiment of the present disclosure pertains to roads in a hazardous area. The ability to understand the potential consequence associated with flammable materials and roadways can be an essential part of safety for any relevant facility. FIG. 17 shows an example of a representation showing a road 60. This capability allows for more refinement in the analysis of roads as opposed to analyzing entire roads as individual large objects. In step 8a, each road 60 is created as a series of sections so when creating a road, the user will identify the beginning of the next section of road by pointing with a mouse or other tool. Using sections provides the unique ability to determine at what precise locations a road has the highest potential consequence.

Figure 11:
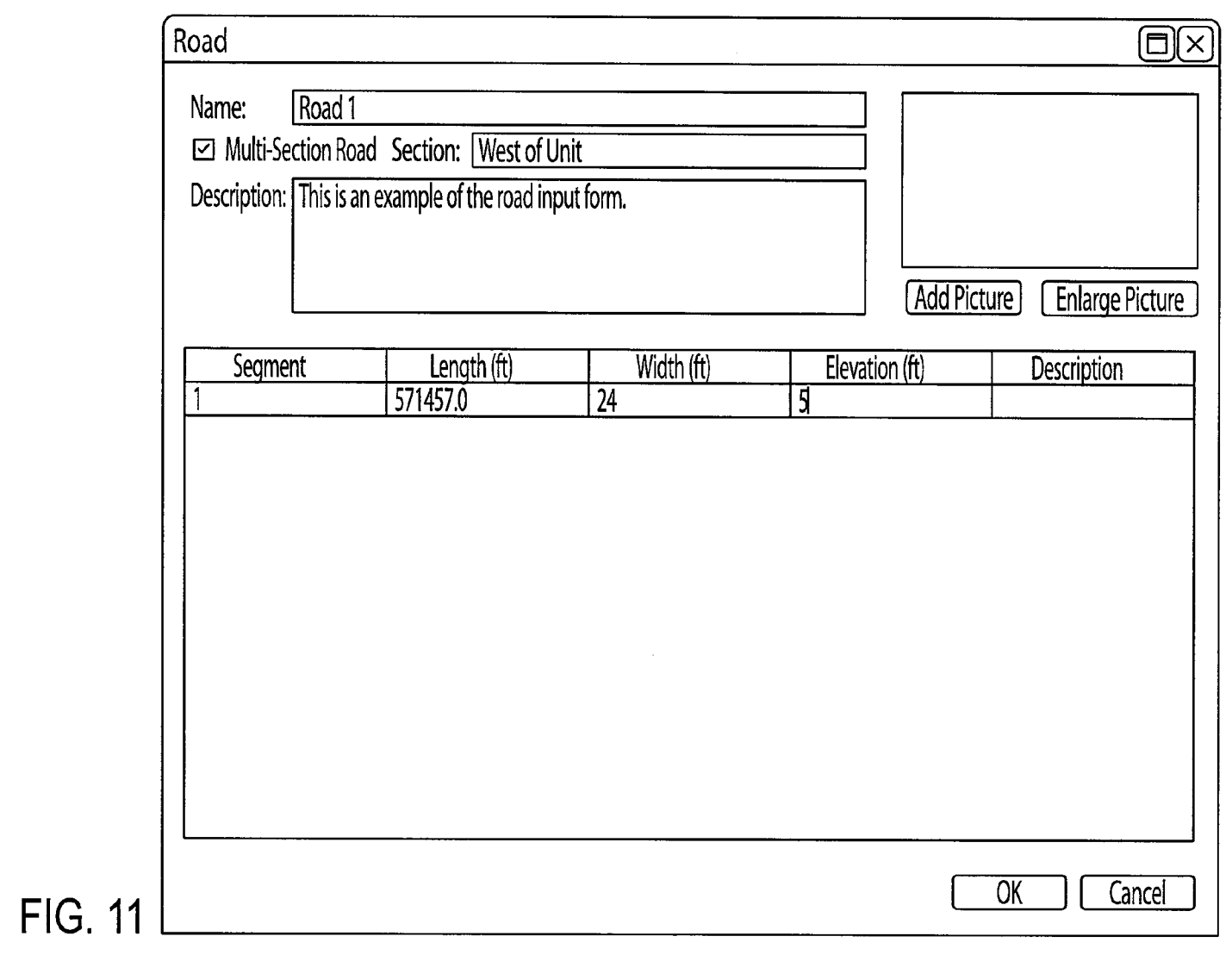

In step 8b, a user inputs the width and elevation for each section. FIG. 11 shows an example of a road input form. The width is an important element and HACTool. The elevation is optional, however, providing the elevation will allow for the roads to be analyzed in a 3-dimensional aspect. In other embodiments, any further information about the road available is entered in step 8c. This includes the road name, whether it has multiple sections, if so, the section name, a picture if available, and any additional descriptions or comments about the entire road or each section individually. When identifying multiple section roads, the user divides a road into multiple, non-connecting sections. This is useful for modeling any roads that have large breaks or interruptions. Once the user has defined a road as multiple sections, the section name is entered. This allows for the recognition of road sections in analyses and reports. The option to split roads into multiple non-connecting sections provides the user an immense amount of flexibility when deciding his method for analyzing facility roads. The HACTool also provides the ability for pictures and additional descriptions to be entered giving user the chance to store any data relevant to any given study.

Once each relevant road is entered into HACTool, a roads analysis may be conducted to determine which hazardous areas cover each road section as well as how much of each road these areas cover in step 9. This data is provided in the Roads Report. The roads report provides the comparison of each road and relevant input data with the results of the analysis performed. The results generated from the analysis include "Source Name", "Contour", "Length Covered" and "Fraction Covered". "Source Name" shows each release source that touches a road in the given study. A release source name may show up more than once if it touches more than one road just as a Road. The name will appear multiple times if multiple sources effect it. "Contour" gives an industry accepted, abbreviated form of the specific type of hazardous area classification that is effecting the road for respective source. "Length Covered" shows the distance between the furthest possible vertices from which the road touches the given contour. "Fraction Covered" displays the area as a fraction of 1 that the given source contour will cover on the respective road section. Other parameters may also be included as needed.

Figure 12:
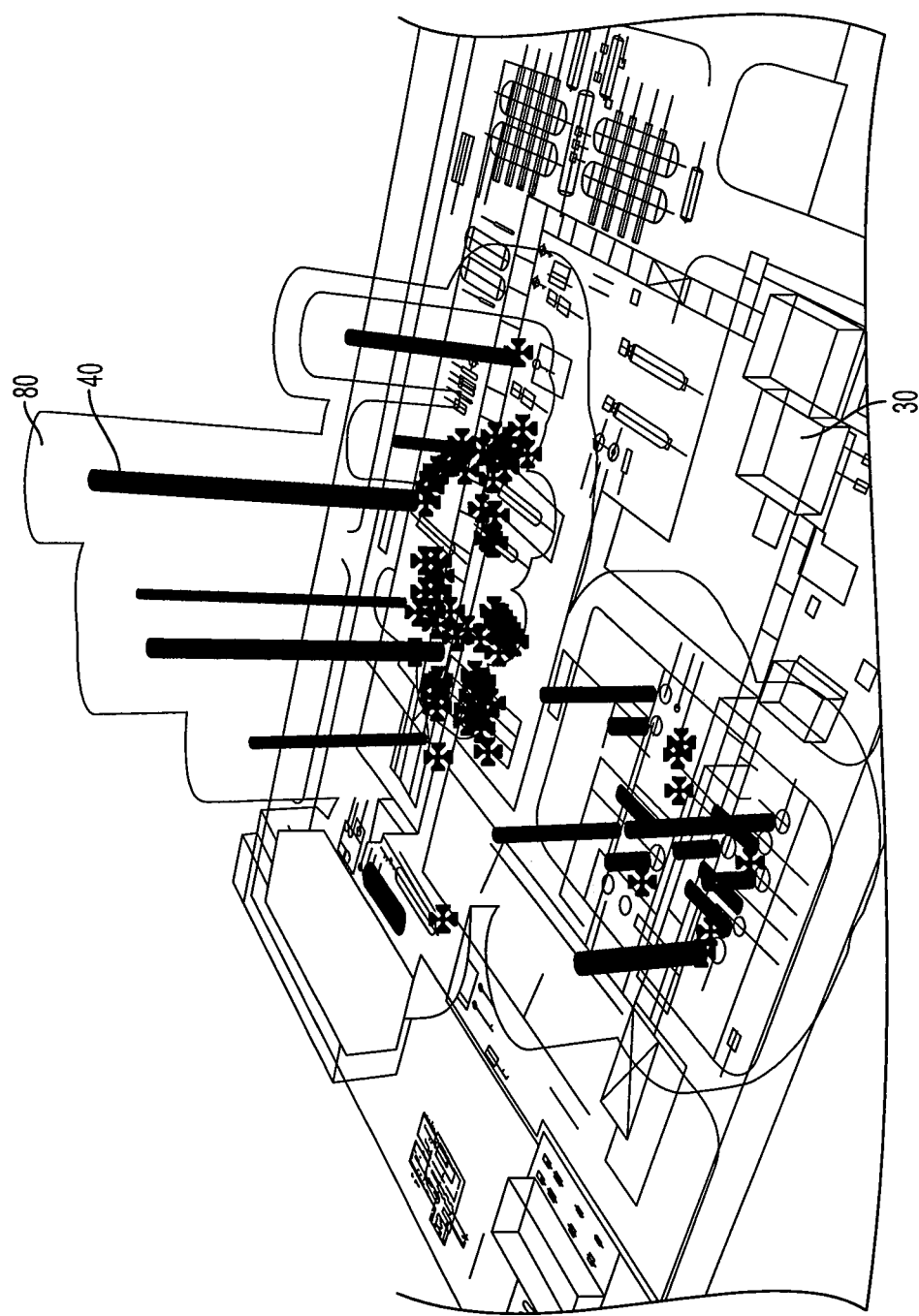
FIG. 12 is a perspective view of a 3-dimensional representation indicating hazardous area contours according to another embodiment of the present disclosure.
Figure 13:
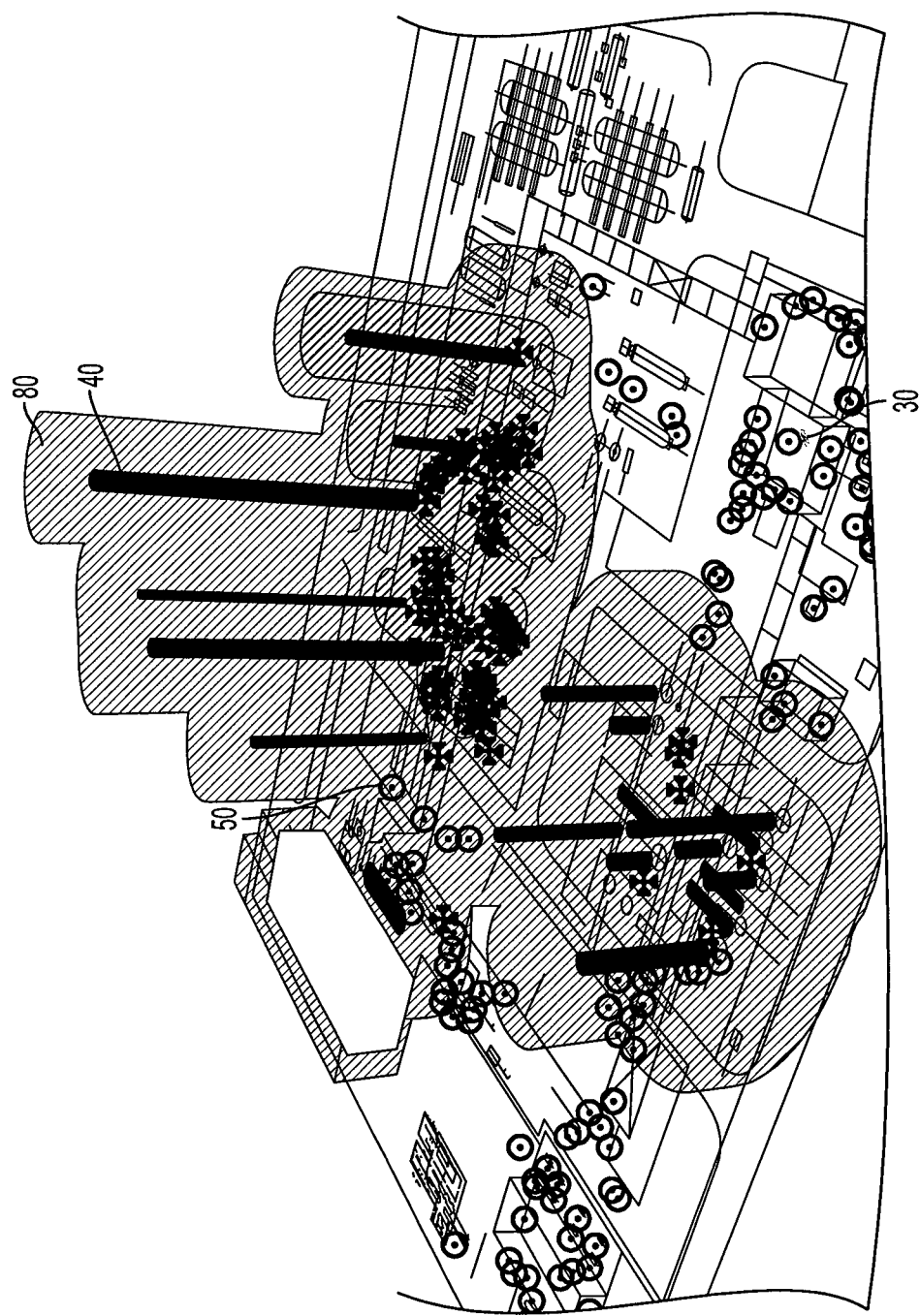
FIG. 13 is a perspective view of a 3-dimensional representation indicating hazardous area contours and electrical hazards according to another embodiment of the present disclosure.

The processor is then used to determine the position of a hazardous area in the region based on any of the information obtained in the above steps. The processor generates a representation of the hazardous area in the region. In some embodiments, the representation is in the form of a 2-dimensional map. FIG. 8 shows a 2-dimensional map indicating the hazardous areas 40 surrounding the perimeter of the release points 20 contained within buildings 30. A 3-dimensional representation of the representation of FIG. 8 is shown in FIG. 12. As is shown, the 3-dimensional representation provides height information regarding the hazardous areas 40 as well as longitudinal and latitudinal information. FIG. 13 is the same representation as FIG. 12, except that FIG. 13 includes ignition sources 50. Identification of the ignition sources 50 in FIG. 13 in 3 dimensional space allows for a user to better plan safety features in a plant.

Other concepts relate to unique software for implementing the hazardous area classification system. A software product, in accord with this concept, includes at least one machine-readable medium and information carried by the medium. The information carried by the medium may be executable program code, one or more databases and/or information regarding hazardous area classification systems.

As shown by the above discussion, functions relating to the hazardous area classification system may be implemented on computers connected for data communication via the components of a packet data network. Although special purpose devices may be used, such devices also may be implemented using one or more hardware platforms intended to represent a general class of data processing device commonly used to run "server" programming so as to implement the classification functions discussed above, albeit with an appropriate network connection for data communication.

As known in the data processing and communications arts, a general-purpose computer typically comprises a central processor or other processing device, an internal communication bus, various types of memory or storage media (RAM, ROM, EEPROM, cache memory, disk drives, etc.) for code and data storage, and one or more network interface cards or ports for communication purposes. The software functionalities involve programming, including executable code as well as associated stored data, e.g. files used for the hazardous area classification system. The software code is executable by the general-purpose computer that functions as the server and/or that functions as a terminal device. In operation, the code is stored within the general-purpose computer platform. At other times, however, the software may be stored at other locations and/or transported for loading into the appropriate general-purpose computer system. Execution of such code by a processor of the computer platform enables the platform to implement the methodology for hazardous area classification in essentially the manner performed in the implementations discussed and illustrated herein.

Figure 19:
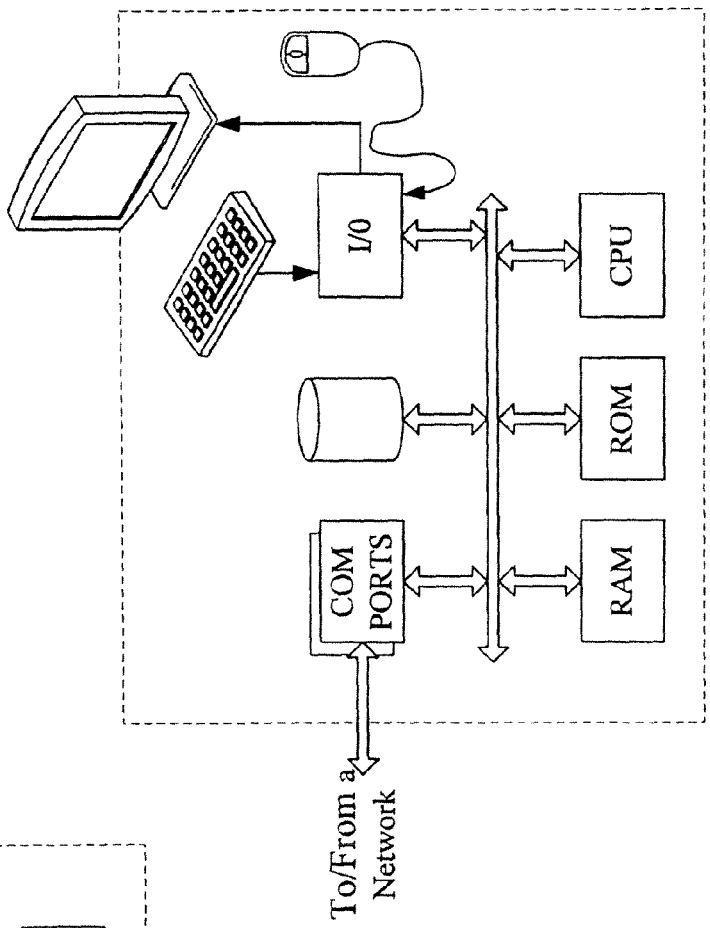
FIG. 19 is a simplified functional block diagram of a personal computer or other work station or terminal device.
Figure 18:
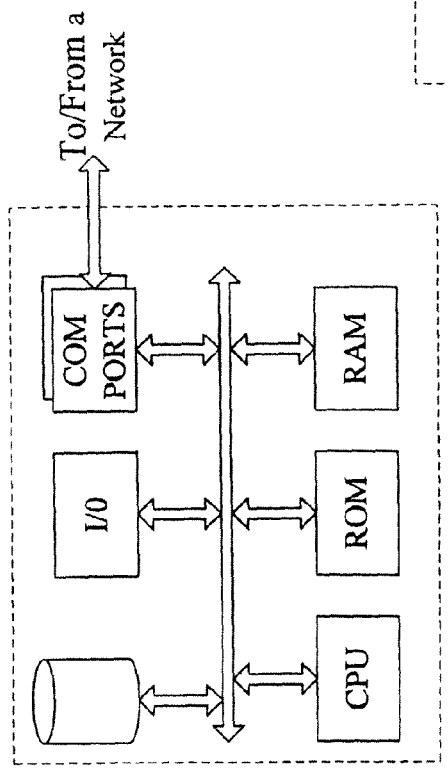
FIG. 18 is a simplified functional block diagram of a computer that may be configured as a host or server, for example, to function as the processor in a hazardous area classification system of one embodiment of the present disclosure.

FIGS. 18 and 19 provide functional block diagram illustrations of general purpose computer hardware platforms. FIG. 18 illustrates a network or host computer platform, as may typically be used to implement a server. FIG. 19 depicts a computer with user interface elements, as may be used to implement a personal computer or other type of work station or terminal device, although the computer of FIG. 19 may also act as a server if appropriately programmed. It is believed that those skilled in the art are familiar with the structure, programming and general operation of such computer equipment and as a result the drawings should be self-explanatory.

A server, for example, includes a data communication interface for packet data communication. The server also includes a central processing unit (CPU), in the form of one or more processors, for executing program instructions. The server platform typically includes an internal communication bus, program storage and data storage for various data files to be processed and/or communicated by the server, although the server often receives programming and data via network communications. The hardware elements, operating systems and programming languages of such servers are conventional in nature, and it is presumed that those skilled in the art are adequately familiar therewith. Of course, the server functions may be implemented in a distributed fashion on a number of similar platforms, to distribute the processing load.

Hence, aspects of the methods of hazardous area classification outlined above may be embodied in programming. Program aspects of the technology may be thought of as "products" or "articles of manufacture" typically in the form of executable code and/or associated data that is carried on or embodied in a type of machine readable medium. "Storage" type media include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer of the service provider into the computer platform of the user that will be the server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the calculation steps, processing steps, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The present disclosure can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the disclosure. However, it should be recognized that the present disclosure can be practiced without resorting to the details specifically set forth. In other instances, well known processing structures have not been described in detail, in order not to unnecessarily obscure the present disclosure.

Only a few examples of the present disclosure are shown and described herein. It is to be understood that the disclosure is capable of use in various other combinations and environments and is capable of changes or modifications within the scope of the inventive concepts as expressed herein.

The invention claimed is:

1. A hazardous area classification system comprising:
   one or more processors; and
   a non-transitory computer readable medium containing instructions that, when executed, cause the one or more processors to perform the steps of:
   inputting a plurality of predetermined parameters associated with a location;
   analyzing the plurality of predetermined parameters as indicative of a potential hazard in the location;
   determining a position of a hazardous area for the location using a calculation based on the analysis of the plurality of predetermined parameters; and
   generating a representation of the hazardous area.

2. The hazardous area classification system of claim 1, wherein the predetermined parameters comprise:
   a quantity of a material,
   a temperature of the material, and
   a pressure of the material.

3. The hazardous area classification system of claim 1, wherein the predetermined parameters comprise:
   a size of a container containing a material, and
   a rate of flow of the material within the container.

4. The hazardous area classification system of claim 1, wherein the predetermined parameters comprise a release point where a material is releasable from a container containing the material.

5. The hazardous area classification system of claim 1, wherein the predetermined parameters comprise a parameter of a building in which a container containing a material is housed.

6. The hazardous area classification system of claim 1, wherein the predetermined parameters comprise a location of an ignition source.

7. The hazardous area classification system of claim 1, wherein the predetermined parameters comprise at least one parameter of a road.

8. The hazardous area classification system of claim 7, wherein the at least one predetermined parameter of the road comprises:
   a location of the road,
   a size of the road, and
   an amount of vehicular activity on the road.

9. The hazardous area classification system of claim 1, wherein the representation of the hazardous area is a 3-dimensional representation.

10. The hazardous area classification system of claim 1, wherein the representation includes hazardous area contours.

11. The hazardous area classification system of claim 1, wherein the representation includes a report which indicates electrical safety and ignition sources of the hazardous area.

12. The hazardous area classification system of claim 1, wherein the representation includes a report which indicates a risk level and location of electrical equipment within the hazardous area.

13. The hazardous area classification system of claim 1, wherein the representation includes a report which indentifies mislabeled or unvalidated electrical equipment in the hazardous area.

14. A method for hazardous area classification, comprising the steps of:
   inputting a plurality of predetermined parameters related to a material in a location into one or more processors;
   analyzing the plurality of predetermined parameters as indicative of a potential hazard in the location;
   using the one or more processors to determine the position of a hazardous area in the location using a calculation based on the analysis of the plurality of predetermined parameters; and
   using the one or more processors to generate a representation of the hazardous area.

15. The method of claim 14, wherein the predetermined parameters comprise:
   a quantity of a material,
   a temperature of the material, and
   a pressure of the material.

16. The method of claim 14, wherein the predetermined parameters comprise:
   a size of a container containing a material, and
   a rate of flow of the material within the container.

17. The method of claim 14, wherein the predetermined parameters comprise a release point of where a material is releasable from a container containing the material.

18. The method of claim 14, wherein the predetermined parameters comprise a parameter of a building in which a container containing a material is housed.

19. The method of claim 14, wherein the predetermined parameters comprise a location of an ignition source.

20. The method of claim 14, wherein the predetermined parameters comprise a parameter of a road.

21. The method of claim 20, wherein the at least one predetermined parameter of the road comprises:
   a location of the road,
   a size of the road, and
   an amount of vehicular activity on the road.

22. The method of claim 14, wherein the representation of the hazardous area is a 3-dimensional representation.

23. A method for hazardous area classification, comprising the steps of:
   A) selecting a location for analysis;
   B) identifying a material for analysis;
   C) identifying a container for containing the material;
   D) using one or more processors to calculate a stream data for the material based on the quantity, temperature, pressure and rate of flow of the material in the container;
   E) identifying a release point in which the material is releasable from the container;
   F) identifying a parameter of a building in which the material and container are housed;
   G) selecting a region of the location for analysis;
   H) identifying potential ignition sources within the region;
   I) using the one or more processors to determine the position of a hazardous area in the region using a calculation based on the analysis of the information obtained in steps B) through H); and
   J) using the one or more processors to generate a representation of the hazardous area in the region.

24. The method of claim 23, wherein the representation of the hazardous area is a 3-dimensional representation.

25. A non-transitory computer readable medium, containing instructions that, when executed, cause one or more processors to perform the steps of:
   determining a position of a hazardous area for a location using a calculation based on an analysis of a plurality of predetermined parameters as indicative of a potential hazard in the location; and
   generating a representation of the hazardous area.

26. The computer readable medium of claim 25, wherein the predetermined parameters comprise:
   a quantity of a material;
   a temperature of the material; and
   a pressure of the material.

27. The computer readable medium of claim 25, wherein the predetermined parameters comprise:
   a size of a container containing a material, and
   a rate of flow of the material within the container.

28. The computer readable medium of claim 25, wherein the predetermined parameters comprise a release point of where a material is releasable from a container containing the material.

29. The computer readable medium of claim 25, wherein the predetermined parameters comprise a parameter of a building in which a container containing a material is housed.

30. The computer readable medium of claim 25, wherein the predetermined parameters comprise a location of an ignition source.

31. The computer readable medium of claim 25, wherein the predetermined parameters comprise a parameter of a road.

32. The computer readable medium of claim 31, wherein the predetermined parameters of the road comprise:
   a location of the road,
   a size of the road, and
   an amount of vehicular activity on the road.

33. The computer readable medium of claim 25, wherein the representation of the hazardous area is a 3-dimensional representation.

34. The computer readable medium of claim 25, wherein the representation includes hazardous area contours.

35. The computer readable medium of claim 25, wherein the representation includes a report which indicates electrical safety and ignition sources of the hazardous area.

36. The computer readable medium of claim 25, wherein the representation includes a report which indicates defects in a risk level and location of electrical equipment within the hazardous area.

37. The computer readable medium of claim 25, wherein the representation includes a report which identifies mislabeled or unvalidated electrical equipment in the hazardous area.

* * * * *